United States Patent
Liang et al.

[11] Patent Number: 6,150,218
[45] Date of Patent: Nov. 21, 2000

[54] METHOD FOR SIMUTANEOUSLY FORMING BIT-LINE CONTACTS AND NODE CONTACTS

[75] Inventors: Chia-Wen Liang, Hsinchu Hsien; Hal Lee, Taipei, both of Taiwan

[73] Assignee: United Microelectronics Corp., Hsinchu, Taiwan

[21] Appl. No.: 09/175,006

[22] Filed: Oct. 19, 1998

[30] Foreign Application Priority Data

Jun. 17, 1998 [TW] Taiwan ................................. 87109653

[51] Int. Cl.⁷ ................................................ H01L 21/336
[52] U.S. Cl. ...................................... 438/262; 438/256
[58] Field of Search ................................. 438/263, 262, 438/264, 256, 303, 597, 239, 250, 253, 396

[56] References Cited

U.S. PATENT DOCUMENTS

| | | | |
|---|---|---|---|
| 5,629,539 | 5/1997 | Aoki et al. | 257/306 |
| 5,688,713 | 11/1997 | Linliu et al. | 438/253 |
| 5,744,387 | 4/1998 | Tseng | 438/253 |
| 5,776,825 | 7/1998 | Suganaga et al. | 438/253 |
| 5,792,680 | 8/1998 | Sung et al. | 438/255 |
| 5,807,779 | 9/1998 | Liaw | 438/279 |
| 5,814,850 | 9/1998 | Iwasa | 257/296 |
| 5,895,239 | 4/1999 | Jeng et al. | 438/239 |

*Primary Examiner*—Chandra Chaudhari
*Assistant Examiner*—Jack Chen
*Attorney, Agent, or Firm*—Thomas, Kayden, Horstemeyer & Risley

[57] ABSTRACT

A method for simultaneously forming a bit-line contact and a node contact first forms a polysilicon layer and a first insulator on a substrate, and then patterns patterning the polysilicon layer and the first insulator, wherein the substrate consists of an active area and an isolation area. Next, a second insulator is formed on the exposed substrate and the first insulator. Then, by forming a photoresist layer on the second insulator and patterning the photoresist layer, a pattern containing a bit-line contact pattern and a node contact pattern is transferred onto the second insulator. By performing an etching back process on the second insulator, the bit-line contact and the node contact are formed simultaneously in a self-aligned way.

16 Claims, 3 Drawing Sheets

METHOD FOR SIMUTANEOUSLY FORMING BIT-LINE CONTACTS AND NODE CONTACTS

CROSS-REFERENCE TO RELATED APPLICATION

This application claims the priority benefit of Taiwan application serial no. 87109653, filed Jun. 17, 1998, the full disclosure of which is incorporated herein by reference.

BACKGROUND OF THE INVENTION

1. Field of the Invention

This invention relates to a method for fabricating semiconductor devices, and more particularly, to a self-aligned method for simultaneously forming bit-line contacts and node contacts.

2. Description of Related Art

FIG. 1A is a top view of the bit-line contacts and node contacts formed by a conventional fabricating method. FIG. 1B is a cross-sectional view of the I–I' plane showing the structure shown in FIG. 1A.

Bit-line contacts and node contacts are formed conventionally. In FIG. 1A, the entire structure is covered by a dielectric layer (not shown). The structure includes patterned polysilicon layer 102, bit line 104, and nodes 105. The bit line 104 is electrically connected to the substrate underneath through a bit-line contact, and the nodes 105 are electrically connected the substrate underneath through node contacts. Area 108 is the patterned to form the bit-line contact, and areas 106 are patterned to form the node contacts.

FIG. 1B is a cross-sectional view showing the structure as seen from plane 1, in which the substrate includes an isolation area 110 and an active area 112. The structure also includes a patterned polysilicon layer 102, spacers 114, which are formed on the sides of the polysilicon layer 102, and an insulator 116. Conventionally, a photoresist layer 118 is formed on the substrate and individually patterned into the pattern of the bit-line contact 108 and the patterns of the node contacts 106, as shown in FIG. 1A. The bit-line contact 108' and the node contacts 106' are formed by performing photolithography processes on the patterned photoresist layer 118.

Since the bit-line contact 108' and the node contacts 106' are individual openings, the formation of contacts is limited by the photolithography resolution as the dimension of devices is downsized. Because the separation between contact openings has to be wider than 0.22 μm, the dimensions of contact openings cannot exceed a certain size. Furthermore, the separated contact openings increase the complication of the fabrication process, so the occurrence of alignment errors is increased as well. Moreover, the limitation on the contact dimensions makes the photolithographic windows of bit lines and nodes small, so the difficulties of the fabrication process increase.

SUMMARY OF THE INVENTION

It is therefore an objective of the present invention to provide a method for simultaneously forming bit-line contacts and node contacts. The method of the contacts and node contacts. While the etching back process is performed on the dielectric layer above a polysilicon layer, the bit-line contacts and node contacts are formed by a self-aligned process regardless of the limitation of photolithography resolution.

In accordance with the foregoing objective of the present invention, the invention provides a method for simultaneously forming bit-line contacts and node contacts, wherein the method includes forming and patterning a polysilicon layer and a first insulator on a substrate first. The substrate includes an isolation area and an active area. The follow-up steps include forming a second insulator on the substrate, and forming a photoresist on the second insulator. The pattern containing information of bit-line contacts and node contacts is transferred onto the second insulator. Then, by performing an etching back process on the second insulator and applying a self-aligned method, the bit-line contacts and node contacts are formed simultaneously.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for simultaneously fabricating bit-line contacts and node contacts.

Figure 1A:
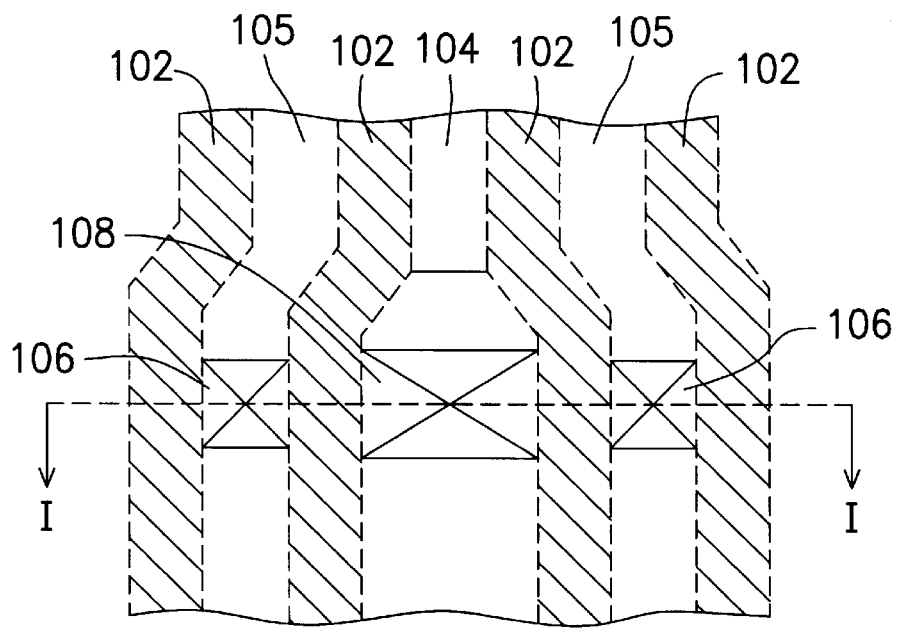
FIG. 1A is a top view of the bit-line contacts and node contacts formed by a conventional fabricating method.
Figure 1B:
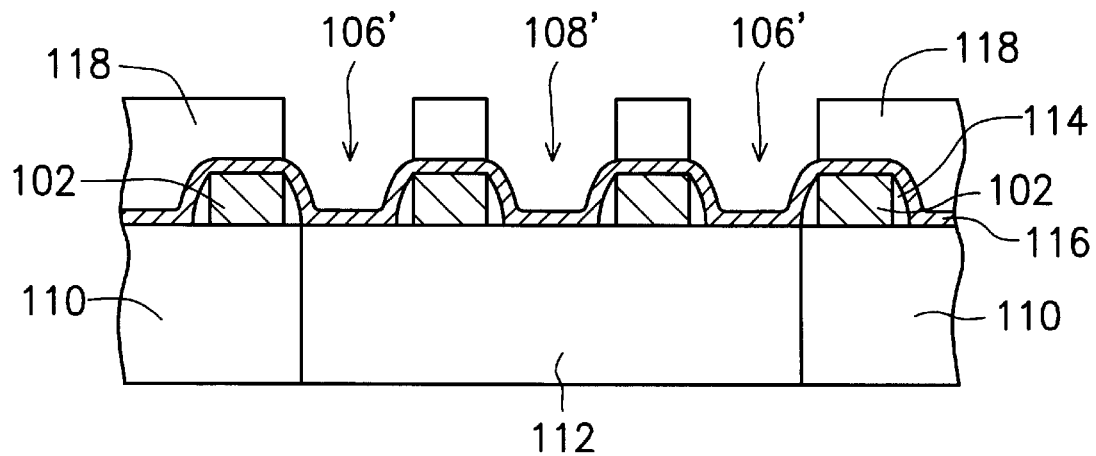
FIG. 1B is a cross-sectional view showing the bit-line contacts and node contacts shown in FIG. 1A viewed from plane 1.
Figure 2A:
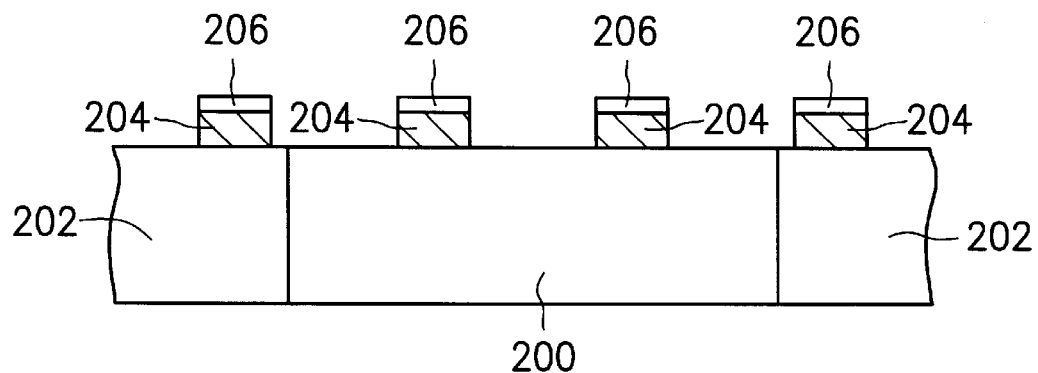
FIGS. 2A through 2E are cross-sectional views showing the fabricating method of a preferred embodiment according to the invention.

In FIG. 2A, a polysilicon layer 204 and a first insulator 206 are formed on a provided substrate, wherein the substrate contains an isolation area 202 and an active area 200. The polysilicon layer 204 and the first insulator 206 are patterned to expose a portion of the substrate by a conventional photolithography and etching process. The first insulator 206 includes oxide or silicon nitride.

Figure 2B:
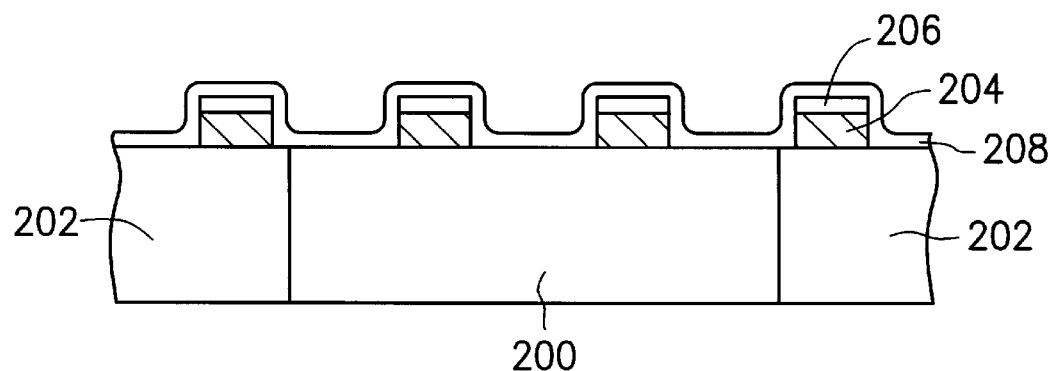

In FIG. 2B, a second insulator 208 is formed on the substrate to cover the patterned first insulator 206. The thickness of the second insulator is about 100–300 Å. The formation of the second insulator includes forming a thick insulator and performing an etching back process on the thick insulator to a thickness of about 100–300 ÅA. The second insulator 208 includes oxide or silicon nitride.

Figure 2C:
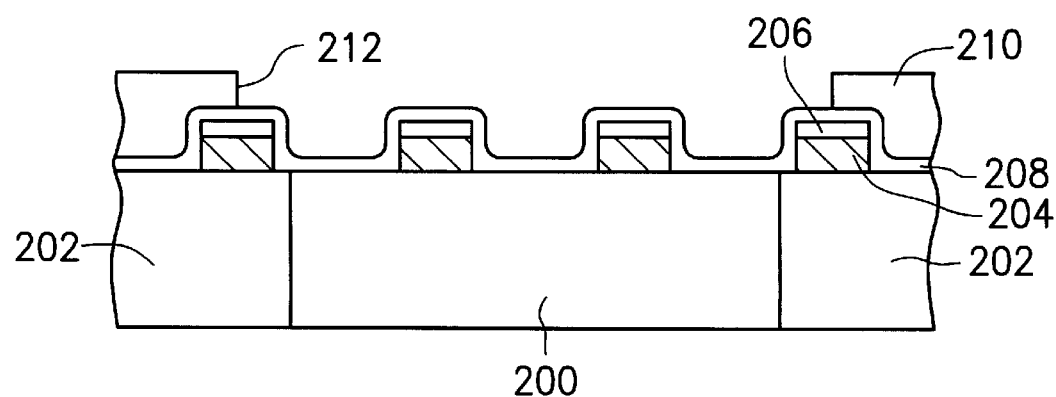
Figure 2D:
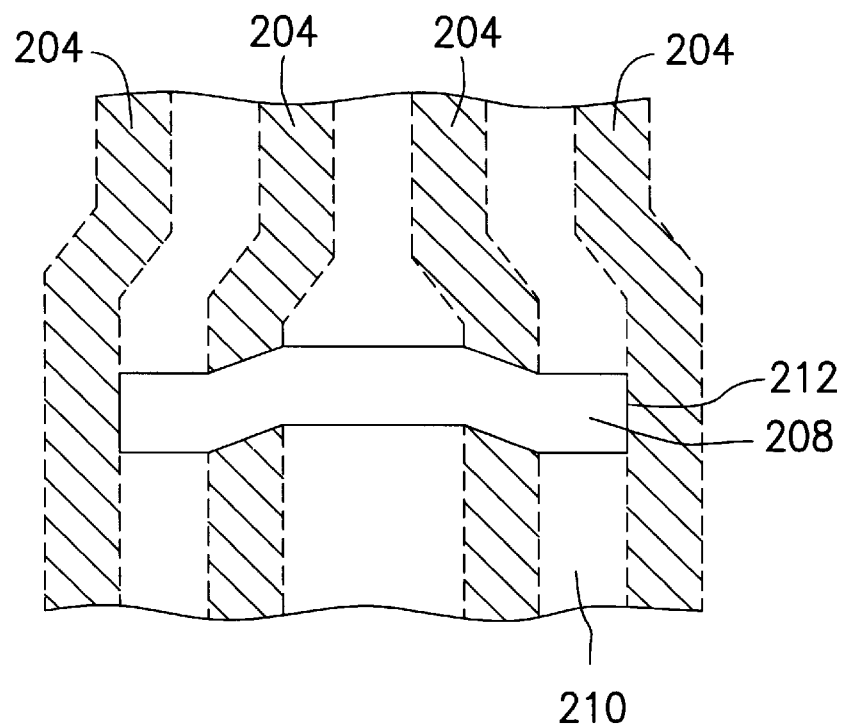

In FIG. 2C, a photoresist layer 210 is formed on the substrate and patterned. The patterned photoresist layer 210 contains a pattern 212 of bit-line contacts and node contacts, and the pattern 212 is transferred onto the second insulator 208 as shown in FIG. 2D. The photoresist layer 210 covering the patterned polysilicon layer 204 contains a pattern 212 including the information for the bit-line contacts and node contacts, wherein the pattern 212 exposes the underneath second insulator 208.

Figure 2E:
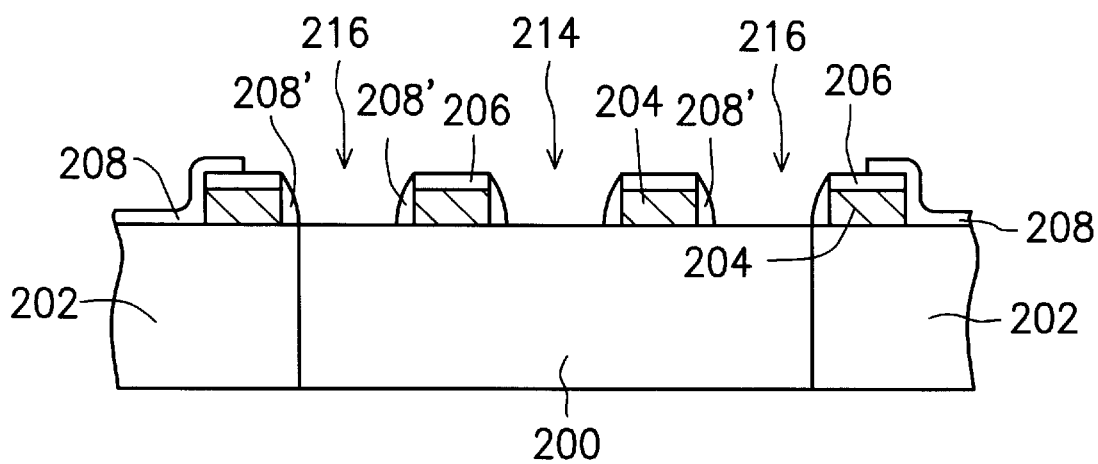

In FIG. 2E, an etching back process is performed on the exposed portion of the second insulator 208 to expose the substrate, wherein the etching process leaves spacers 208' on either side of the first insulator 206 and the polysilicon layer 204. Hence, the foregoing etching back process is a self-aligned process. After the photoresist layer 210 is removed, the bit-line contacts 214 and the node contacts 216 are formed simultaneously.

Therefore, a specificity of the invention is to provide a method for forming bit-line contacts and node contacts simultaneously. Because the dimension of the pattern containing both the bit-line contacts and the node contacts is larger, the yield when fabricating small-dimension contacts is less limited by the photolithography resolution.

It is another specificity of the invention to provide a method for simultaneously forming bit-line contacts and node contacts by a self-aligned process to eliminate the misalignment problem that happens in a conventional method. Hence, the fabrication process is performed more easily and smoothly.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for simultaneously forming a bit-line contact and a node contact, the method comprising:

providing a substrate;

forming a polysilicon layer on the substrate;

forming a first insulator on the polysilicon layer;

patterning the first insulator and the polysilicon layer to expose a portion of the substrate;

forming a second insulator on the exposed portion of the substrate and the first insulator, wherein the second insulator has a thickness;

forming a photoresist layer on the second insulator;

patterning the photoresist layer; and removing a portion of the second insulator, to simultaneously form a spacer abutting on either side of the polysilicon layer and the first insulator, and leave portions of the second insulator on a top surface of the first insulator, and to form the bit-line contact and the node contact, wherein the bit-line contact and the node contact are continuous.

2. The method of claim 1, wherein the step of patterning the photoresist layer further comprises:

patterning the photoresist layer to form a pattern on the photoresist layer, wherein the pattern contains a bit-line contact pattern and a node contact pattern, wherein the pattern is a continuous pattern; and transferring the pattern onto the second insulator.

3. The method of claim 1, wherein the step of removing a portion of the second insulator includes performing an etching back process.

4. The method of claim 1, wherein the thickness of the second insulator is about 100–300 Å.

5. The method of claim 1, wherein the first insulator includes oxide.

6. The method of claim 1, wherein the first insulator includes silicon nitride.

7. The method of claim 1, wherein the second insulator includes oxide.

8. The method of claim 1, wherein the second insulator includes silicon nitride.

9. A method for simultaneously forming a bit-line contact and a node contact, the method comprising:

providing a substrate;

forming a polysilicon layer on the substrate;

forming a first insulator on the polysilicon layer;

patterning the first insulator and the polysilicon layer to expose a portion of the substrate;

forming a second insulator on the exposed portion of the substrate and the first insulator;

removing a portion of the second insulator, wherein the second insulator has a thickness;

forming a photoresist layer on the second insulator;

patterning the photoresist layer to form a pattern on the photoresist layer, wherein the pattern contains a bit-line contact pattern and a node contact pattern, wherein the pattern is a continuous pattern;

transferring the pattern onto the second insulator; and removing a portion of the second insulator, to simultaneously form leave a spacer abutting on either side of the polysilicon layer and the first insulator and leave portions of the second insulator on a top surface of the first insulator, and to form the bit-line contact and the node contact.

10. The method of claim 9, wherein the step of removing a portion of the second insulator includes performing an etching back process.

11. The method of claim 9, wherein the thickness of the second insulator is about 100–300 Å.

12. The method of claim 9, wherein the first insulator includes oxide.

13. The method of claim 9, wherein the first insulator includes silicon nitride.

14. The method of claim 9, wherein the second insulator includes oxide.

15. The method of claim 9, wherein the second insulator includes silicon nitride.

16. A method for simultaneously forming a bit-line contact and a node contact, the method comprising the steps of:

forming a polysilicon layer on a substrate;

forming a first insulator on the polysilicon layer;

patterning the first insulator and the polysilicon layer to expose a portion of the substrate and a sidewall of the polysilicon layer;

forming a conformal second insulator abutting the exposed portion of the substrate, the sidewall of the polysilicon layer and the first insulator;

forming a photoresist layer on the second insulator to expose a portion of the second insulator, wherein the portion of the second insulator corresponds to the polysilicon layer and a bit-line contact region and a node contact region formed in the subsequent steps; and after the forming step of the photoresist layer, etching the exposed portion of the second insulator, to simultaneously form a spacer on the first insulator and the sidewall of the polysilicon layer and leave portions of the second insulator on a top surface of the first insulator, and to form the bit-line contact and the node contact, wherein the bit-line contact and the node contact are continuous.

* * * * *